US012666893B2

(12) United States Patent
Zhang et al.

(10) Patent No.: US 12,666,893 B2
(45) Date of Patent: Jun. 23, 2026

(54) SIDEWALL INORGANIC PASSIVATION FOR DIELECTRIC ETCHING VIA SURFACE MODIFICATION

(71) Applicant: Tokyo Electron Limited, Tokyo (JP)

(72) Inventors: Du Zhang, Albany, NY (US); Yu-Hao Tsai, Albany, NY (US); Mingmei Wang, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 216 days.

(21) Appl. No.: 17/988,217

(22) Filed: Nov. 16, 2022

(65) Prior Publication Data

US 2024/0162043 A1 May 16, 2024

(51) Int. Cl.
| | |
|---|---|
| *H10P 50/24* | (2026.01) |
| *H10P 14/60* | (2026.01) |
| *H10P 14/68* | (2026.01) |

(52) U.S. Cl.
CPC ........ *H10P 50/244* (2026.01); *H10P 14/6319* (2026.01); *H10P 14/6336* (2026.01); *H10P 14/6532* (2026.01); *H10P 14/683* (2026.01)

(58) Field of Classification Search
CPC ............................................... H01L 21/00–86
See application file for complete search history.

(56) References Cited

U.S. PATENT DOCUMENTS

| | | | |
|---|---|---|---|
| 7,364,665 B2 | 4/2008 | Li et al. | |
| 8,461,050 B2 | 6/2013 | Araki et al. | |
| 9,378,971 B1 | 6/2016 | Briggs et al. | |
| 9,620,377 B2 | 4/2017 | Hudson et al. | |
| 11,342,195 B1 * | 5/2022 | Han | H01L 21/02274 |
| 2007/0175858 A1 | 8/2007 | Cheung | |
| 2008/0230519 A1 | 9/2008 | Takahashi | |
| 2013/0078773 A1 | 3/2013 | Xu et al. | |
| 2017/0178899 A1 | 6/2017 | Kabansky | |
| 2017/0178920 A1 * | 6/2017 | Dole | H10D 1/00 |

(Continued)

FOREIGN PATENT DOCUMENTS

| | | | | |
|---|---|---|---|---|
| WO | WO-2018026867 A1 * | 2/2018 | ....... | C23C 16/45525 |
| WO | 2021162871 A1 | 8/2021 | | |

OTHER PUBLICATIONS

International Search Report and Written Opinion, PCT Application No. PCT/US2023/030522, mailed Dec. 7, 2023, 11 pages.

(Continued)

*Primary Examiner* — Binh X Tran
*Assistant Examiner* — Andrew Keelan Laobak
(74) *Attorney, Agent, or Firm* — Slater Matsil, LLP

(57) ABSTRACT

A method for processing a substrate that includes: performing a cyclic process including a plurality of cycles, where the cyclic process includes, forming a carbon-containing layer over sidewalls of a recess in a Si-containing dielectric layer of the substrate, the forming including exposing the substrate disposed in a plasma processing chamber to a first plasma generated from a first gas including carbon and hydrogen, modifying a surface of the carbon-containing layer by exposing the substrate to a second plasma generated from a second gas including oxygen, and forming a passivation layer over the modified surface of the carbon-containing layer by exposing the substrate to a third gas including B, Si, or Al.

20 Claims, 11 Drawing Sheets

(56) References Cited

U.S. PATENT DOCUMENTS

| | | |
|---|---|---|
| 2017/0229325 A1 | 8/2017 | Lubomirsky |
| 2018/0211845 A1* | 7/2018 | Hsu ..................... H01L 21/3081 |
| 2020/0035800 A1* | 1/2020 | Tsai .................. H10D 30/0323 |
| 2021/0143016 A1 | 5/2021 | Yokoyama et al. |
| 2021/0391181 A1 | 12/2021 | Chang et al. |
| 2022/0199410 A1 | 6/2022 | Zhang et al. |
| 2022/0351980 A1* | 11/2022 | Hasso ........................ C08J 3/05 |

OTHER PUBLICATIONS

Atlasov et al., "Effect of sidewall passivation in BCl3/N2 inductively coupled plasma etching of two-dimensional GaAs photonic crystals," Journal of Vacuum Science & Technology B: Microelectronics and Nanometer Structures Processing, Measurement, and Phenomena vol. 27, No. 5, L21-L24, Aug. 28, 2009; doi: 10.1116/1.3205004.

* cited by examiner

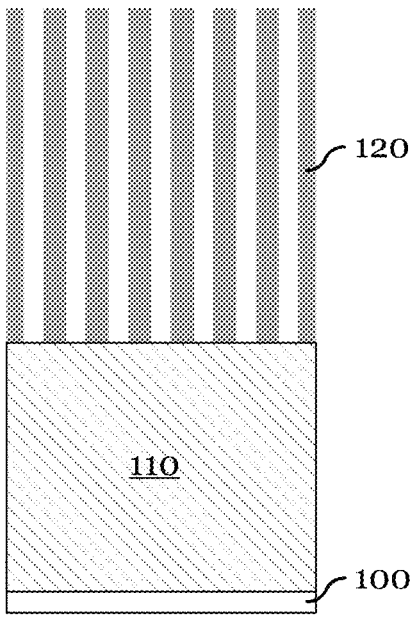
FIG. 1
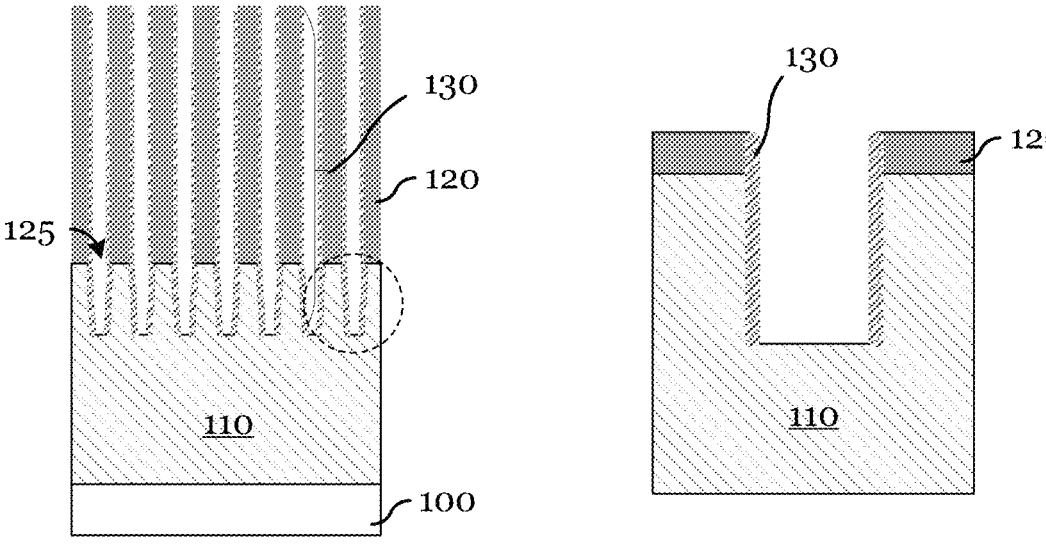
FIG. 2
FIG. 3

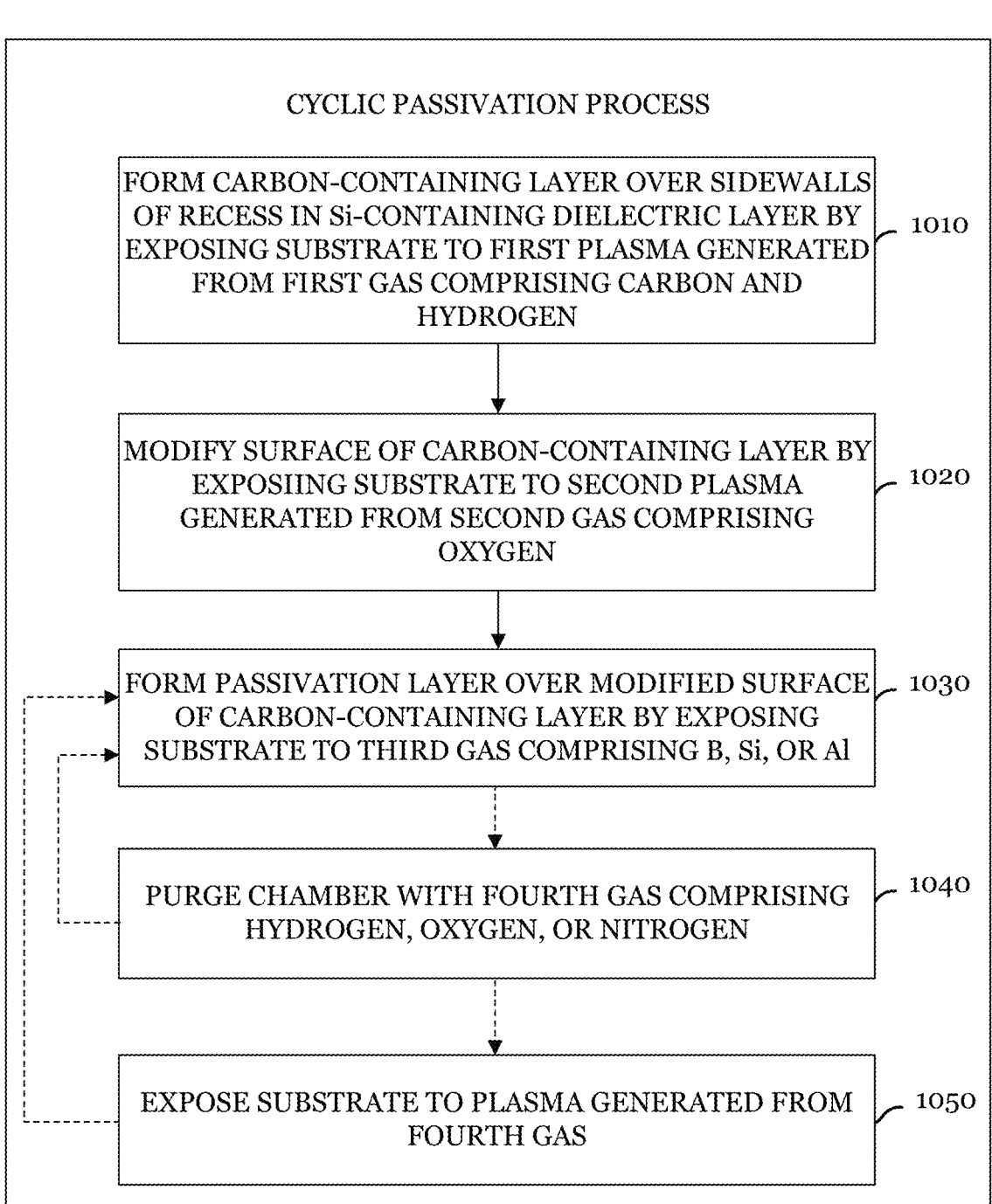

1000

CYCLIC PASSIVATION PROCESS

FORM CARBON-CONTAINING LAYER OVER SIDEWALLS OF RECESS IN Si-CONTAINING DIELECTRIC LAYER BY EXPOSING SUBSTRATE TO FIRST PLASMA GENERATED FROM FIRST GAS COMPRISING CARBON AND HYDROGEN — 1010

MODIFY SURFACE OF CARBON-CONTAINING LAYER BY EXPOSIING SUBSTRATE TO SECOND PLASMA GENERATED FROM SECOND GAS COMPRISING OXYGEN — 1020

FORM PASSIVATION LAYER OVER MODIFIED SURFACE OF CARBON-CONTAINING LAYER BY EXPOSING SUBSTRATE TO THIRD GAS COMPRISING B, Si, OR Al — 1030

PURGE CHAMBER WITH FOURTH GAS COMPRISING HYDROGEN, OXYGEN, OR NITROGEN — 1040

EXPOSE SUBSTRATE TO PLASMA GENERATED FROM FOURTH GAS — 1050

FIG. 10A

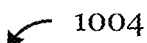

1004

CYCLIC PROCESS

FORM RECESS IN Si-CONTAINING DIELECTRIC LAYER BY EXPOSING SUBSTRATE TO FIRST PLASMA GENERATED FROM FIRST GAS COMPRISING CARBON AND FLUORINE, WHERE FIRST CARBONACEOUS LAYER IS FORMED OVER SIDEWALLS OF RECESS — 1006

FORM SECOND CARBONACEOUS LAYER OVER FIRST CARBONACEOUS LAYER BY EXPOSING SUBSTRATE TO SECOND PLASMA GENERATED FROM SECOND GAS COMPRISING CARBON AND HYDROGEN — 1014

MODIFY SURFACE OF SECOND CARBONACEOUS LAYER TO BE HYDROPHILIC — 1024

DEPOSIT PASSIVATION LAYER OVER SECOND CARBONACEOUS LAYER BY EXPOSING SUBSTRATE TO THIRD GAS COMPRISING B, Si, OR Al — 1034

PURGE CHAMBER WITH FOURTH GAS COMPRISING HYDROGEN, OXYGEN, OR NITROGEN — 1044

EXPOSE SUBSTRATE TO PLASMA GENERATED FROM FOURTH GAS — 1054

EXTEND RECESS VERTICALLY BY PLASMA ETCH PROCESS — 1064

FIG. 10C

SIDEWALL INORGANIC PASSIVATION FOR DIELECTRIC ETCHING VIA SURFACE MODIFICATION

TECHNICAL FIELD

The present invention relates generally methods of processing a substrate, and, in particular embodiments, to sidewall inorganic passivation for dielectric etching via surface modification.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method for processing a substrate that includes: performing a cyclic process including a plurality of cycles, where the cyclic process includes, forming a carbon-containing layer over sidewalls of a recess in a Si-containing dielectric layer of the substrate, the forming including exposing the substrate disposed in a plasma processing chamber to a first plasma generated from a first gas including carbon and hydrogen, modifying a surface of the carbon-containing layer by exposing the substrate to a second plasma generated from a second gas including oxygen, and forming a passivation layer over the modified surface of the carbon-containing layer by exposing the substrate to a third gas including B, Si, or Al.

In accordance with an embodiment of the present invention, a method for processing a substrate that includes: performing a cyclic passivation process in a plasma processing chamber having a plasma source, the cyclic passivation process including a plurality of cycles, where a cycle of the cyclic passivation process includes powering the plasma source to sustain a first plasma generated from a first gas including carbon and hydrogen, depositing a carbonaceous layer over a Si-containing dielectric layer of the substrate by exposing the substrate to the first plasma, oxidizing a surface of the carbonaceous layer, depositing a passivation layer over the carbonaceous layer by exposing the substrate to a second gas including B, Si, or Al without powering the plasma source, and purging the plasma processing chamber with a third gas including a hydrogen-containing gas, an oxygen-containing gas, or a nitrogen-containing gas.

In accordance with an embodiment of the present invention, a method for processing a substrate that includes: performing a plurality of cycles of a cyclic etch process to form a recess in a Si-containing dielectric layer of a substrate loaded in a plasma processing chamber, the substrate including a patterned etch mask formed over the Si-containing dielectric layer, one of the plurality of cycles of the cyclic etch process including forming a recess in the Si-containing layer by exposing the substrate to a first plasma generated from a first gas including carbon and fluorine, the exposing forming a first carbonaceous layer over sidewalls of the recess; forming a second carbonaceous layer over the first carbonaceous layer by exposing the substrate to a second plasma generated from a second gas including carbon and hydrogen; modifying a surface of the second carbonaceous layer to be hydrophilic; depositing a passivation layer over the second carbonaceous layer by exposing the substrate to a third gas including B, Si, or Al; purging the plasma processing chamber with a fourth gas including a hydrogen-containing gas, an oxygen-containing gas, or nitrogen-containing gas; and extending the recess vertically by a plasma etch process, the passivation layer preventing laterally etching the Si-containing dielectric layer.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates a cross-sectional view of an example incoming substrate comprising a dielectric layer and a patterned hardmask layer in accordance with various embodiments;

FIG. 2 illustrates a cross-sectional view of the substrate after an initial dielectric etch in accordance with various embodiments;

FIG. 3 illustrates a cross-sectional view of a recess of the substrate illustrated in FIG. 3;

FIGS. 4A-4E illustrate cross-sectional views of the recess of the substrate during the passivation process at various stages in accordance with various embodiments, wherein FIG. 4A illustrates the recess after a carbonaceous layer deposition, FIG. 4B illustrates the recess after a first surface modification step, FIG. 4C illustrates the recess after a passivation layer deposition, FIG. 4D illustrates the recess after a second surface modification step, and FIG. 4E illustrates the recess after a subsequent anisotropic etch process with sidewall passivation;

FIGS. 6A-6B illustrate cross-sectional views of a recess of another example substrate during the passivation process in accordance with other embodiments, wherein FIG. 6A illustrates the recess without a carbonaceous layer, and FIG. 6B illustrates the recess after the passivation process;

FIGS. 10A-10C illustrate process flow charts of methods of passivation process in accordance with various embodiments, wherein FIG. 10A illustrates an embodiment process flow, FIG. 10B illustrates an alternate embodiment process flow, and FIG. 10C illustrate another alternate embodiment process flow.

Figure 4A:
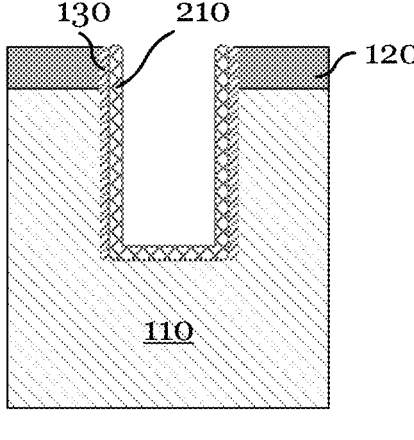

DETAILED DESCRIPTION OF ILLUSTRATIVE
EMBODIMENTS

This application relates to fabrication of semiconductor devices, for example, integrated circuits comprising semiconductor devices, and more particularly to high capacity three-dimensional (3D) memory devices, such as a 3D-NAND (or vertical-NAND), 3D-NOR, or dynamic random access memory (DRAM) device. The fabrication of such devices may generally require forming conformal, high aspect ratio (HAR) features (e.g., a contact hole) of a circuit element. Features with aspect ratio (ratio of height of the feature to the width of the feature) higher than 50:1 are generally considered to be high aspect ratio features, and in some cases fabricating a higher aspect ratio such as 100:1 may be desired for advanced 3D semiconductor devices. In such applications, HAR features may be formed in a dielectric layer (e.g., silicon oxide, silicon nitride, or oxide/nitride layer stack) by a highly anisotropic plasma etch process with high fidelity. However, as the target AR increases, the high fidelity of etch profile becomes harder to maintain with conventional HAR etch methods. For example, with insufficient sidewall passivation, bowing may worsen during an elongated etch process time.

Embodiments of the present application disclose methods of passivation, particularly the methods of using an inorganic-based sidewall passivation layer (e.g., a passivation layer containing boron (B), silicon (Si), or aluminum (Al)) for HAR dielectric etching. Various embodiments of this disclosure describe improved methods of anisotropically etching a Si-containing dielectric layer with sidewall passivation. The inventors of this application have identified that multi-steps of organic- and inorganic-layer deposition and surface modification may be used to enable an effective sidewall passivation.

In the following, steps of a plasma etch process with sidewall passivation in accordance with various embodiments are described referring to FIGS. 1-3, 4A-4E, and 5. The effect of process parameters on vapor deposition of a carbonaceous layer is also described in FIGS. 7 and 8 together with FIG. 4A. Another variation of the methods is described referring to FIGS. 6A-6B. An energy level diagram for the adsorption of an inorganic species (BCl₃) during the passivation layer formation is then described in FIG. 9. Several embodiment process flows of semiconductor fabrication are then described referring to FIGS. 10A-10C. An example plasma processing tool for the embodiment methods is illustrated in FIG. 11. All Figures in the disclosure, including the aspect ratios of features, are not to scale and for illustration purposes only.

In various embodiments, the methods of passivation may be based on forming an inorganic passivation layer comprising B, Si, or Al, and may comprise the following steps: (1) vapor deposition of a carbonaceous layer terminating with *CH groups (hydrophobic); (2) first surface modification to convert the surface of the carbonaceous layer to hydrophilic (e.g., converting the *CH groups of the carbonaceous layer to *COH groups by oxidation); (3) passivation layer formation (e.g., non-plasma exposure to BCl₃ to form *COBCl₂ on surface); and (4) second surface modification to reinforce the passivation layer (e.g., N₂/H₂ plasma treatment to form *COBCl(NH₂) on surface). In certain embodiments, the steps (3) and (4) may be repeated to continue depositing and form a thicker passivation layer (e.g., a layer comprising boron nitride-like polymeric species such as *CO[BCl(NH)]ₓBCl(NH₂)). After the passivation, a dielectric etch may be performed to fabricate a high aspect ratio (HAR) feature while the formed inorganic passivation layer may advantageously prevent lateral etching. Details of each step of the methods of passivation will be further described below referring to FIGS. 1-3, 4A-4E, and 5.

FIG. 1 illustrates a cross-sectional view of an example incoming substrate 100 comprising a dielectric layer 110 and a patterned hardmask layer 120 in accordance with various embodiments.

In one or more embodiments, the substrate 100 may be a silicon wafer, or a silicon-on-insulator (SOI) wafer. In certain embodiments, the substrate may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate.

In various embodiments, the substrate 100 is a part of, or includes, a semiconductor device, and may have undergone a number of steps of processing following, for example, a conventional process. For example, the semiconductor structure may comprise the substrate 100 in which various device regions are formed. At this stage, the substrate 100 may include isolation regions such as shallow trench isolation (STI) regions as well as other regions formed therein.

The dielectric layer 110 may be formed over the substrate 100. In various embodiments, the dielectric layer 110 is a target layer that is to be patterned into one or more high aspect ratio (HAR) features. In certain embodiments, the HAR feature being etched into the dielectric layer 110 may be a contact hole, slit, or other suitable structures comprising a recess. In certain embodiments, the dielectric layer 110 may be a silicon oxide layer. In alternate embodiments, the dielectric layer 110 may comprise silicon nitride, silicon oxynitride, an O/N/G/N layer stack (stacked layers of oxide and nitride), or any suitable materials that might be used, e.g., in a three-dimensional 3D-NAND stack. The dielectric layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the dielectric layer 110 has a thickness between 1 μm and 10 μm. In another embodiment, the dielectric layer 110 may comprise a layer stack with each layer of the stack having a thickness between 50 nm and 2.5 μm.

Still referring to FIG. 1, the patterned hardmask layer 120 is formed over the dielectric layer 110. In various embodiments, the patterned hardmask layer 120 may comprise amorphous carbon layer (ACL). In one or more embodiments, the patterned hardmask layer 120 may comprise spin-on carbon, tungsten carbide, boron carbide, or other suitable carbon-containing mask materials. The patterned hardmask layer 120 may be formed by first depositing a hardmask layer using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The deposited hardmask layer may then be patterned using a lithography process and an anisotropic etch process, for example, using oxygen-based etch chemistry. The relative thicknesses of the patterned hardmask layer 120 and the dielectric layer 110 may have any suitable relationship. For example, the patterned hardmask layer 120 may be thicker than the dielectric layer 110, thinner than the dielectric layer 110, or the same thickness as the dielectric layer 110. In certain embodiments, the patterned hardmask layer 120 has a thickness between 1 μm and 4 μm. In one embodiment, the patterned hardmask layer 120 comprises amorphous carbon layer (ACL) and has a thickness of 2.5 μm and a critical dimension (CD) of 75 nm, although in other embodiments, the thickness and the CD of the patterned hardmask layer 120 may have any suitable values, respectively.

The patterned hardmask layer 120 and the dielectric layer 110 may be collectively considered as a part of the substrate 100. Further, the substrate 100 may also comprise other layers. For example, for the purpose of patterning the hardmask layer, a tri-layer structure comprising a photoresist layer, SiON layer, and optical planarization layer (OPL) may be present.

FIG. 2 illustrates a cross-sectional view of the substrate 100 after an initial dielectric etch in accordance with various embodiments.

FIG. 3 illustrates a cross-sectional view of a recess of the substrate 100 illustrated in FIG. 2.

Fabricating the HAR feature in the dielectric layer 110 may be performed by a plasma etch process using a combination of process gases in accordance with various embodiments. Since the methods of passivation in this disclosure may be targeted at sidewall passivation, the plasma etch process may comprise the initial dielectric etch to first form a recess having sidewalls prior to the passivation process.

The plasma etch process may comprise a reactive ion etching (RIE) process that uses a halogen-containing etch gas. In various embodiments, the etch gas may comprise a hydrofluorocarbon, a combination of a hydrocarbon and a fluorine-containing gas, or a combination of a fluorocarbon and a hydrogen-containing gas. In certain embodiments, one or more fluorocarbons may be used as a primary etch gas. For example, a saturated fluorocarbon, an unsaturated fluorocarbon, or a combination thereof may be included in a process gas. In this disclosure, an unsaturated fluorocarbon refers to any compound comprising carbon and fluorine with at least one carbon-carbon double bond (C=C bond) or triple bond (C≡C bond), and a saturated fluorocarbon refers to any compound comprising carbon and fluorine without any C=C bond or C≡C bond. In certain embodiments, the unsaturated fluorocarbon may comprise hexafluorobutadiene ($C_4F_6$), hexafluoro-2-butyne ($C_4F_6$), or hexafluorocyclobutene ($C_4F_6$), and the saturated fluorocarbon may comprise octafluoropropane ($C_3F_8$), perfluorobutane ($C_4F_{10}$), or perflenapent ($C_5F_{12}$).

In certain embodiments, other gases such as a noble gas or a balancing agent may also be added to the process gas. In this disclosure, any list that presents possible compositions, conditions, or process variations includes any reasonable combination thereof, and thus the term "or" used in the list does not indicate any exclusive selection of a particular composition, condition, or process variation. For example, in certain embodiments, argon (Ar) and dioxygen ($O_2$) may be included as the noble gas and the balancing agent, respectively. In alternate embodiments, the combination of gases may further comprise a third fluorocarbon. In one embodiment, the third fluorocarbon may be octafluorocyclobutane ($C_4F_8$), octafluoro-2-butene ($C_4F_8$), hexafluoropropylene ($C_3F_6$), carbon tetrafluoride ($CF_4$), or fluoroform ($CHF_3$). While above examples are primarily fluorine-based etch gases, other halogen-containing gases may also be used (e.g., $BCl_3$, $Cl_2$, and HBr).

Still referring to FIG. 2, recesses 125 may be formed in the dielectric layer 110 by the initial dielectric etch. The recesses 125 may be in any shapes and structures, for example designed to fabricate a contact hole, slit, or other suitable structures comprising a recess useful for semiconductor device fabrication. In various embodiments, the features defined by the recesses 125 has a critical dimension (CD) of 200 nm or less. In certain embodiments, the CD may be between 50 nm and 200 nm. For example, the feature may comprise a slit with a CD of about 150 nm. In alternate embodiments, the recesses 125 may comprise a hole that has a top opening with a diameter of 80 nm or less.

It should be noted that, as illustrated in FIG. 2, the initial dielectric etch should be terminated before bowing may occur substantially. Accordingly, the recesses 125 may be formed straight and uniformly across the substrate 100 with little to no bowing. Bowing refers to the deviation of a perfectly straight recess from a purely anisotropic profile to a recess having outward curvature. Bowing may generally occur near the top of sidewalls of the etch target (e.g., the dielectric layer 110), and may be caused by the bending of incident ion trajectories of ions used during the plasma etching process. Bowing may result in a widening of the critical dimension of a semiconductor device, and may ultimately cause a collapse of fabricated features. Although conventional HAR etch methods may provide some degree of sidewall passivation, for example, through a polymeric passivation layer comprising carbon and fluorine (a *CF layer 130 in FIGS. 2 and 3), bowing may still occur especially if the etch process time is elongated to increase the aspect ratio of the feature. This potential bowing issue may advantageously be prevented by the methods of passivation as further described below.

FIGS. 4A-4E illustrate cross-sectional views of a recess of the substrate illustrated in FIG. 2 during the passivation process at various stages in accordance with various embodiments. FIG. 4A illustrates a cross-sectional view of the recess after a carbonaceous layer deposition.

After the initial dielectric etch (FIGS. 2 and 3), a carbonaceous layer comprising carbon and hydrogen (a *CH layer 210) may be deposited over the *CF layer 130. The surface of the *CH layer 210 may be mostly terminated with *CH groups. In various embodiments, the *CH layer 210 may be deposited by vapor deposition such as chemical vapor deposition (CVD) and plasma-enhanced CVD (PECVD). In other embodiments, wet deposition techniques may also be used. Any appropriate precursors comprising carbon and hydrogen may be used. In certain embodiments, hydrocarbon (e.g., $CH_4$ or $C_2H_6$) or hydrofluorocarbon (e.g., $CHF_3$) may be used as a precursor gas for the PECVD. This deposition process may be controlled to provide a thin, conformal layer that can function as an underlying layer for a passivation layer to be formed. The *CH layer 210 may have a thickness between 0.1 nm and 10 nm in one embodiment, and between 1 nm and 5 nm in another embodiment.

Profile control for the uniform and sidewall-selective deposition of the *CH layer 210 may be achieved, for example, by adjusting sticking coefficient and ion energy.

Figure 7:
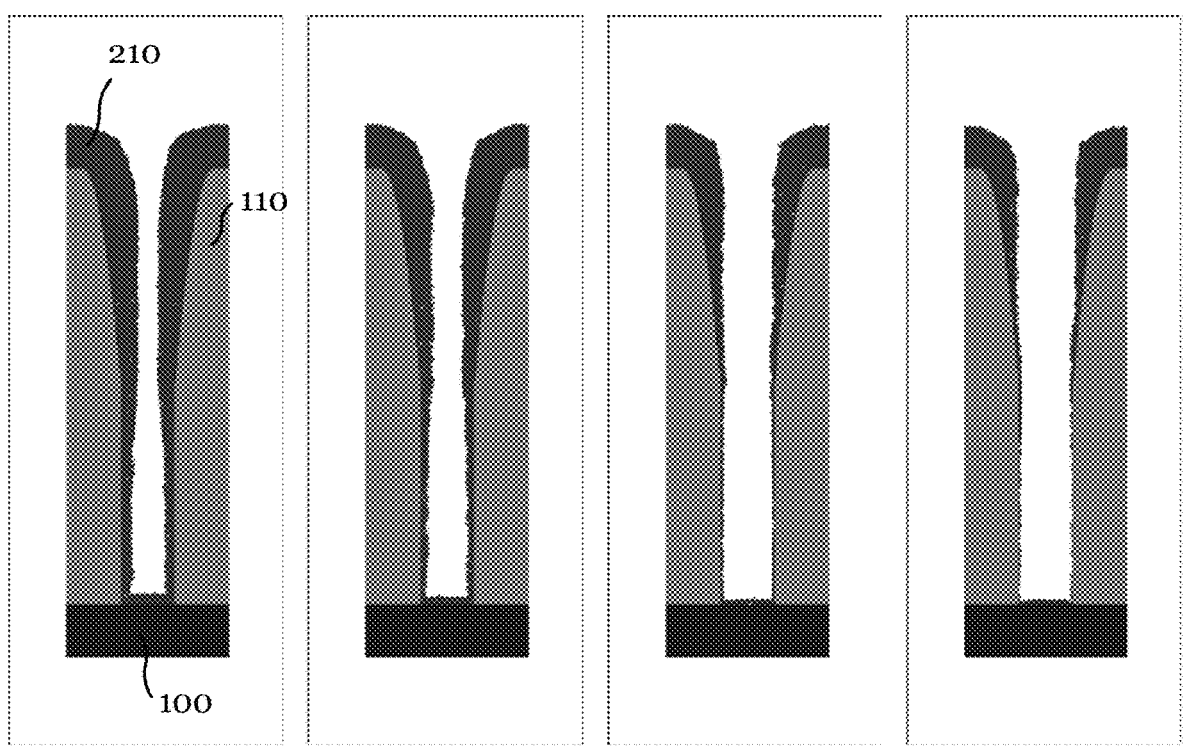
FIG. 7 illustrates cross sectional views of example substrates with different patterns of a carbonaceous layer as a result of vapor deposition control on sticking coefficient.

FIG. 7 illustrates cross sectional views of example substrates with different patterns of a carbonaceous layer as a result of vapor deposition control on sticking coefficient.

Figure 8:
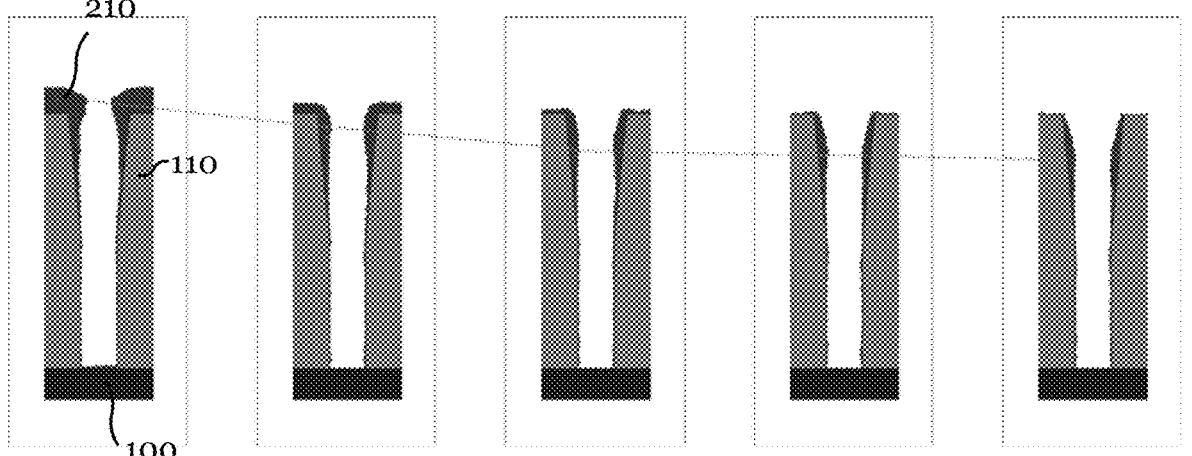
FIG. 8 illustrates cross sectional views of example substrates with different patterns of a carbonaceous layer as a result of vapor deposition control on ion energy.

FIG. 8 illustrates cross sectional views of example substrates with different patterns of a carbonaceous layer as a result of vapor deposition control on ion energy.

The inventors of this application performed modeling simulations to demonstrate the effect of deposition process conditions on the profile of the *CH layer 210 formed over the dielectric layer 110. In FIG. 7, the sticking coefficient of reactive species decreases from left to right. This may be caused by decreasing the hydrogen-to-carbon ratio (C to H) in the reactive species. As the sticking coefficient increases, the conformality of the *CH layer 210 is compromised and the deposition becomes more top selective, suggesting tuning of gas composition and the degree of dissociation under a plasma condition for the vapor deposition step may have a significant impact on the profile of the *CH layer 210. In FIG. 8, the ion energy of the plasma used for the vapor deposition increases from left to right. The increase in ion energy may, for example, be induced by controlling RF bias power, frequency or location. The simulation resulted in a shift of deposition trend from top selective to sidewall selective. The results above indicates that various process parameters for vapor deposition may be selected to optimize the profile of the *CH layer 210. In various embodiments, a thin, conformal layer along the sidewall may particularly advantageous for the subsequent passivation layer formation.

Figure 4B:
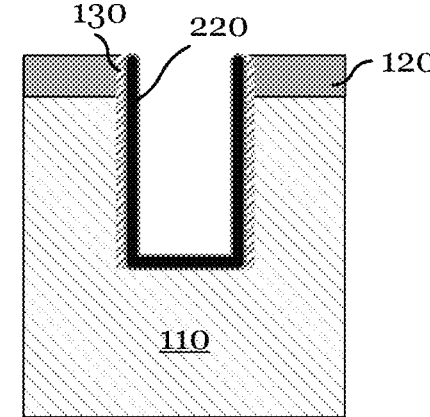

FIG. 4B illustrates a cross-sectional view of the recess after a first surface modification step.

Referring back to FIG. 4B, the first surface modification step may be performed to modify the surface characteristic of the *CH layer 210 formed by the deposition step described above. The inventors of this application identified that successful inorganic passivation layer formation may require a hydrophilic surface where inorganic precursors can react with. However, the surface of the *CH layer 210 terminating with the *CH groups may be hydrophobic and less reactive with the inorganic precursors. Accordingly, in various embodiments, the first surface modification step may be performed to make the surface of the *CH layer 210 more hydrophilic. The hydrophilic surface of the *CH layer 210 is denoted by a *COH layer 220 in FIG. 4B. In one embodiment, an exposure to a plasma generated from a gas comprising oxygen (e.g., $O_2$ or $O_3$) may be used as the first surface modification step to oxidize the surface and introduce hydroxyl (OH) groups to the *CH layer 210. In alternate embodiments, any appropriate dry or wet oxidation treatment may be used. For example, non-plasma treatment with ozone ($O_3$) or a wet treatment with hydrogen peroxide ($H_2O_2$) may be used.

In FIG. 4B, the *COH layer 220 replaces the entirety of the *CH layer 210 of FIG. 4A for illustration purpose. However, in various embodiments, only the surface of *CH layer 210 may be modified by the first surface modification step, and the bulk of the *CH layer 210 below the surface may remain intact. For convenience, the *COH layer 220 is used in this disclosure to collectively refer to any layer structure whose surface is hydrophilic. The *COH layer 220 may thereby comprise the *CH layer 210 below its surface. Further, the surface of the *COH layer 220 may not be limited to OH groups. In certain embodiments, the surface of the *COH layer 200 may comprise any functional groups that exhibit more hydrophilicity than *CH groups. Such functional groups include a carbonyl (C=O) group, a carboxyl (COOH) group, and an amino group ($NH_2$) group.

In various embodiments, the initial two steps of (1) vapor deposition of a carbonaceous layer and (2) the first surface modification described above may be combined or performed continuously. For example, the first step of vapor deposition may be performed as a PECVD process using a process gas comprising hydrocarbon, and after the carbonaceous layer is formed, the process gas may be switched to $O_2$ under the presence of a plasma to start the first surface modification step. In another embodiment, the process gas may comprise an oxidative gas from the start of the vapor deposition step such that the carbonaceous layer may have a hydrophilic characteristic as it is being formed, in which case a separate surface modification step may be skipped. Such a continuous embodiment may be realized by a PECVD process using a gas comprising hydrocarbon (e.g., $CH_4$ or $C_2H_6$) and $O_2$. Various process parameters including gas composition, pressure, source and bias powers, process time may be selected in consideration of forming a thin, conformal carbonaceous layer whose surface is hydrophilic.

Figure 4C:
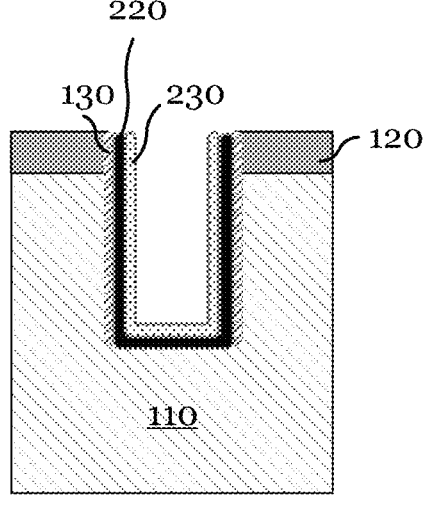

FIG. 4C illustrates a cross-sectional view of the recess after a passivation layer deposition.

In FIG. 4C, a passivation layer 230 may be formed over the *COH layer 220 in the recess. In various embodiments, the formation of the passivation layer 230 may be performed by exposing the substrate to a passivation gas in the absence of a plasma (plasma-off passivation step; i.e., when power to plasma is turned OFF). At this stage, the passivation gas may be adsorbed over the *COH layer 220 and may thermally react with the surface of the *COH layer 220 in the absence of a plasma. The passivation layer 230 may be primarily adsorbed or polymerized species of the passivation gas. Further, the absence of plasma-excitation during the exposure to the passivation gas may advantageously enable conformal formation of the passivation layer 230 in the recess along the sidewalls. The embodiment methods may also rely on less plasma usage, which may offer benefits of power efficiency and longer chamber lifetime.

In various embodiments, the passivation gas may comprise a boron (B)-containing gas, a silicon (Si)-containing gas, or an aluminum (Al)-containing gas. Examples of the B-containing gas comprise $BCl_3$, $BH_3$, and $BBr_3$. Examples of the Si-containing gas comprise $SiCl_xH_{4-x}$ (x=0-4) and $Si_2Cl_xH_{6-x}$ (x=0-6). Examples of the Al-containing gas comprise $AlCl_3$ and $AlF_x$ $(CH_3)_{3-x}$ (x=0-2). In certain embodiments, the passivation gas may be a mixture of any of these gases above at any ratio. In addition, in one or more embodiments, the passivation gas may further comprise an optional admixture of inert gas comprising Ar, He, Xe, or Ne. In certain embodiments, the formation of the passivation layer 230 may be performed at a total gas flow between 1 sccm and 5000 sccm, a pressure between 5 mTorr and 760 Torr, and a temperature between –100° C. and 200° C. In various embodiments, this deposition step with the passivation gas may be performed with a process time between 1 s and 100 s, for example, 10 s to 300 s in one embodiment. Some process parameters such as flow rate, pressure may be selected to provide sufficient coverage of the sidewalls by the passivation layer 230, while keeping process time as short as possible for better process efficiency.

Figure 4D:
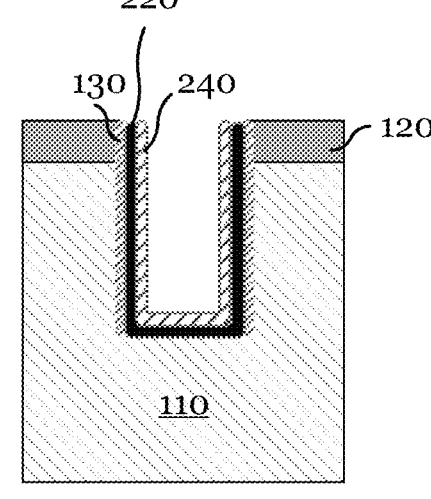

FIG. 4D illustrates a cross-sectional view of the recess after a second surface modification step.

After the deposition of the passivation layer 230, the second surface modification step may be performed to improve the sidewall passivation performance, resulting in a surface-modified passivation layer 240. In FIG. 4D, the surface-modified passivation layer 240 replaces the entirety of the passivation layer 230 of FIG. 4C for illustration purpose. However, in various embodiments, only the surface of the passivation layer 230 may be modified by the second surface modification step, and the bulk of the passivation layer 230 below the surface may remain intact. For convenience, the surface-modified passivation layer 240 is used in this disclosure to collectively refer to any layer structure derived from the passivation layer 230.

The second surface modification step may be performed by exposing the substrate to a process gas under a plasma condition or in the absence of a plasma. In various embodiments, compared to the passivation layer 230, the surface-modified passivation layer 240 may have improved etch resistivity, and thereby better sidewall passivation, in subsequent plasma etch processes.

In various embodiments, the process gas for the second surface modification step may comprise a hydrogen-containing gas, an oxygen-containing gas, or a nitrogen-containing gas. Examples of the hydrogen-containing gas comprise $H_2$, $CH_4$, HBr, $CH_3F$, $H_2O$, $NH_3$, and combinations thereof. Examples of the oxygen-containing gas comprise $O_2$, CO, $CO_2$, and combinations thereof. Examples of the nitrogen-containing gas comprise $N_2$, $NH_3$, and combinations thereof. Although not wishing to be limited by any theory, radical species in the plasma of the second passivation gas may be responsible for modifying the surface of the passivation layer 230. Such a modification may lead to an enhanced sidewall passivation. In certain embodiments, the second surface modification step may induce oxidation or nitridation to form oxide or nitride species comprising B, Si, or Al as the surface-modified passivation layer 240. For oxidation/nitridation, the second surface modification step may use an exposure to $H_2/N_2$ plasma, $H_2/O_2$ plasma, $O_2/CH_4$ plasma, $NH_3$ without plasma, $H_2O$ without plasma, or other suitable oxidizing/nitriding conditions. In alternate embodiments, the second surface modification step may induce reduction to form elemental species comprising B, Si, or Al as the surface-modified passivation layer 240. For reduction, the second surface modification step may use an exposure to $H_2$ plasma, $H_2/CH_4$ plasma, $H_2$/hydrocarbon plasma, or other suitable reducing conditions. In one or more embodiments where the process gas comprises hydrogen, the process gas may further comprise an admixture gas comprising $O_2$, $CO_2$, CO, or $N_2$ mixed at any ratio.

In certain embodiments where the second surface modification step involves a plasma process, plasma processing systems and parameters may be selected to achieve the optimized sidewall passivation. For example, in various embodiments, a capacitively coupled plasma (CCP) system may be used for the second surface modification step, although it is possible to use other plasma systems such as inductively coupled plasma (ICP) or microwave plasma (MW) in other embodiments. The methods of passivation can be advantageously performed in a same plasma tool used for the dielectric etch process (e.g., a system with a CCP chamber) without requiring transporting the substrate between the steps. In one embodiment, a multi-frequency CCP chamber with the ability to de-couple the control of plasma density and ion energy may be used to perform the methods of passivation and the dielectric etch. In addition, in certain embodiments, the process gas for the second surface modification step may further comprise an optional admixture of inert gas comprising Ar, He, Xe, or Ne. In certain embodiments, the exposure to the plasma may be performed at a total gas flow between 1 sccm and 5000 sccm, a pressure between 1 mTorr and 760 Torr, a temperature between −100° C. and 200° C., and an operating frequency between 100 kHz and 10 GHz. In various embodiments, the exposure to the plasma may be performed with a process time between 1 s and 300 s, for example, 1 s to 30 s in one embodiment. To illustrate in one embodiment, a process time is about 10-60 s, a pressure is about 5 mTorr to 1 Torr, a source power is about 500 W to 2500 W, a bias power is about 0 W to 500 W, an $H_2$ flow rate is about 100 sccm to 400 sccm, and an $N_2$ flow rate is about 10 sccm to 75 sccm. Some process parameters such as flow rate, pressure may be selected to provide sufficient modification of the passivation layer 230, while keeping process time as short as possible for better process efficiency.

In various embodiments, the steps of passivation layer formation (FIG. 4C) and second surface modification (FIG. 4D) may be repeated in a cyclic fashion in order to continue growing the passivation layer (e.g., the surface-modified passivation layer 240). For example, using $BCl_3$ for the passivation layer formation and $N_2/H_2$ plasma for the second surface modification step, the initial surface species such as *$COBCl(NH_2)$ may further react to form polymeric structures such as *$CO[BCl(NH)]_xBCl(NH_2)$, each cycle of steps releasing HCl and $NH_3$ into gas phase as by-products. These steps may be repeated for any number of times in the cyclic embodiments to achieve a target thickness of the passivation layer. In certain embodiments, these two steps may be continuously repeated in a same processing chamber such that switching between the steps may be possible without transferring the substrate between different processing chambers.

In alternate embodiments, these two steps may be combined into a single formation step. This combined formation step may enable direct formation of the surface-modified passivation layer 240 (FIG. 4D) over the *COH layer 220 (FIG. 4B). In one embodiment, the combined formation step may use an exposure to a plasma generated from a gas mixture of $H_2$, one or more hydrocarbons (e.g., $CH_4$), and the passivation gas comprising B, Si, or Al. In yet another embodiment, in addition to $H_2$, the hydrocarbon, and passivation gas, the gas mixture may further comprise an oxygen-containing gas or nitrogen-containing gas to enable direct formation of oxide or nitride species comprising B, Si, or Al via oxidation or nitridation.

Figure 4E:
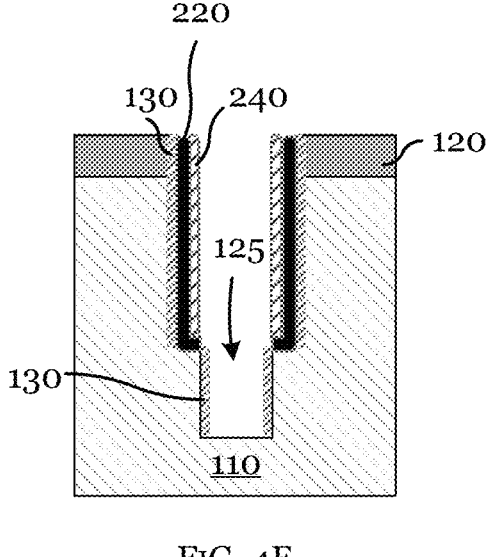

FIG. 4E illustrates a cross-sectional view of the recess after a subsequent anisotropic etch process with sidewall passivation.

Figure 5:
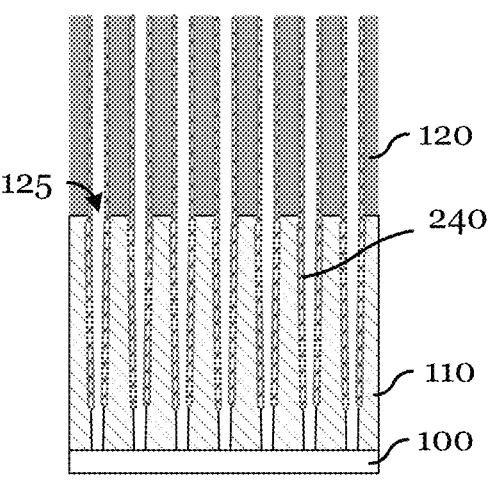
FIG. 5 illustrates a cross-sectional view of the substrate with a high-aspect ratio (HAR) feature after completing a plasma etch process comprising the passivation process in accordance with various embodiments.

FIG. 5 illustrates a cross-sectional view of the substrate 100 with a high-aspect ratio (HAR) feature after completing a plasma etch process comprising the passivation process in accordance with various embodiments.

In the following, the subsequent anisotropic etch process that follows the passivation process is described. At this stage, the subsequent anisotropic etch process extends and deepens the recess 125. With the surface-modified passivation layer 240 protecting the sidewalls of the recess 125 from being laterally etched, the recess 125 may be extended vertically with little to no bowing (FIG. 4E). In various embodiments, the subsequent anisotropic etch process may be a reactive ion etching (RIE) process. In various embodiments, this RIE process may use the same etch gas and process parameters as the initial dielectric etch as described above. In certain embodiments, the RIE process may use a modified etch gas composition and process parameters different from the initial dielectric etch.

As illustrated in FIG. 4E, the newly formed portion of the sidewalls of the recess 125 may be covered by the polymeric passivation layer comprising carbon and fluorine (the *CF layer 130) resulted from the subsequent anisotropic etch process. Similar to the stage after the initial dielectric etch (e.g., FIG. 3), the *CF layer 130 alone may not be sufficient to prevent bowing while completing to form a high aspect ratio (HAR) feature. Accordingly, in various embodiments, after the subsequent anisotropic etch process, the passivation process may be repeated for another cycle of passivation layer formation by following again (1) vapor deposition of a carbonaceous layer terminating with *CH groups (FIG. 4A); (2) first surface modification to convert the surface of the carbonaceous layer to hydrophilic (FIG. 4B); (3) passivation layer formation (FIG. 4C); and (4) second surface modification to reinforce the passivation layer (FIG. 4D). The steps (3) and (4) may be repeated to continue depositing and form a thicker passivation layer. After performing the second cycle of passivation process, another anisotropic etch process may then follow to further extend the recess 125.

By performing a plurality of cycles of the passivation-etch process in accordance with various embodiments as illustrated above (e.g., FIGS. 4A-4E), the vertical recess 125 may extend stepwise and conformally without much bowing or widening a critical dimension. In various embodiments, any number of cycles may be performed until a desired level of etching may be achieved for the target HAR feature. In FIG. 5, the recess 125 extends to, and exposes the surface of the substrate 100. In certain embodiments, in one or more cycles, an anisotropic plasma etch process may be skipped so that a next passivation series may immediately follow a previous passivation series. Such embodiments may advantageously be useful in improving the etch resistivity of a passivation layer or ensuring the coverage of the entire recess by the passivation layer.

It should be noted that formation of the inorganic-based sidewall passivation layer (e.g., containing B, Si, or Al) may require a hydrophilic surface where inorganic precursors can react with. In prior embodiments described above, the sidewalls of the recess being formed in the dielectric layer are covered by a polymeric passivation layer comprising carbon and fluorine (a CF layer). The hydrophilic surface may be formed over the CF layer, prior to the exposure to the inorganic precursors, by (1) vapor deposition of a carbonaceous layer terminating with *CH groups (a *CH layer) (e.g., FIG. 4A) and (2) the first surface modification to convert the surface of the carbonaceous layer to hydrophilic (e.g., oxidation) (e.g., FIG. 4B). In alternate embodiments, these initial steps may be replaced with alternate surface modification steps to expose the dielectric layer on the sidewalls and convert the exposed surface of the dielectric layer to hydrophilic, as further described below.

Figure 6A:
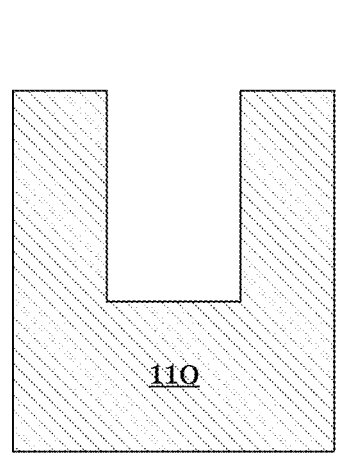
Figure 6B:
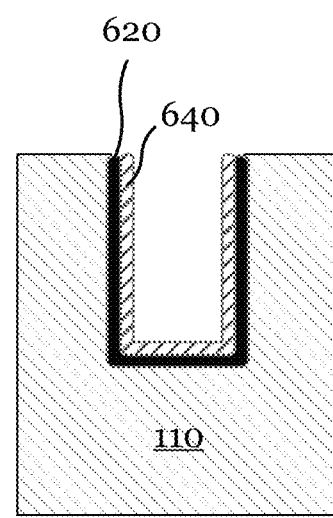

FIG. 6A-6B illustrate cross-sectional views of a recess of another example substrate during the passivation process in accordance with other embodiments. FIG. 6A illustrates the recess without a carbonaceous layer.

In FIG. 6A, the substrate may comprise the recess in a dielectric layer 110 similar to those in FIGS. 2 and 3. Any deposit that may be formed (e.g., the *CF layer 130 in FIG. 3) may be removed by a cleaning step (e.g., ashing), and a surface of the dielectric layer 110 may be exposed at the sidewalls of the recess. In certain embodiments, the dielectric layer 110 may comprise silicon oxide, and the exposed surface of the dielectric layer 110 may be hydrophilic. In one or more embodiments, the surface of the dielectric layer 110 may be treated to increase the hydrophilicity (e.g., a plasma treatment). The inorganic passivation layer may be formed directly over the surface of the dielectric layer 110.

FIG. 6B illustrates a cross-sectional view of the recess after the passivation process.

The subsequent steps may follow as previously described by (3) passivation layer formation (e.g., non-plasma exposure to $BCl_3$); and (4) second surface modification to reinforce the passivation layer (e.g., $N_2/H_2$ plasma treatment). In FIG. 6B, the resulting sidewall structure in the recess may comprise the hydrophilic surface of the dielectric layer 110, denoted by a *SiOH/*SiNH$_2$ layer 620, and a surface-modified passivation layer 640 over the *SiOH/*SiNH$_2$ layer 620. With sidewall passivation, a subsequent anisotropic etch process may follow as previously described above referring to FIGS. 4E and 5.

Figure 9:
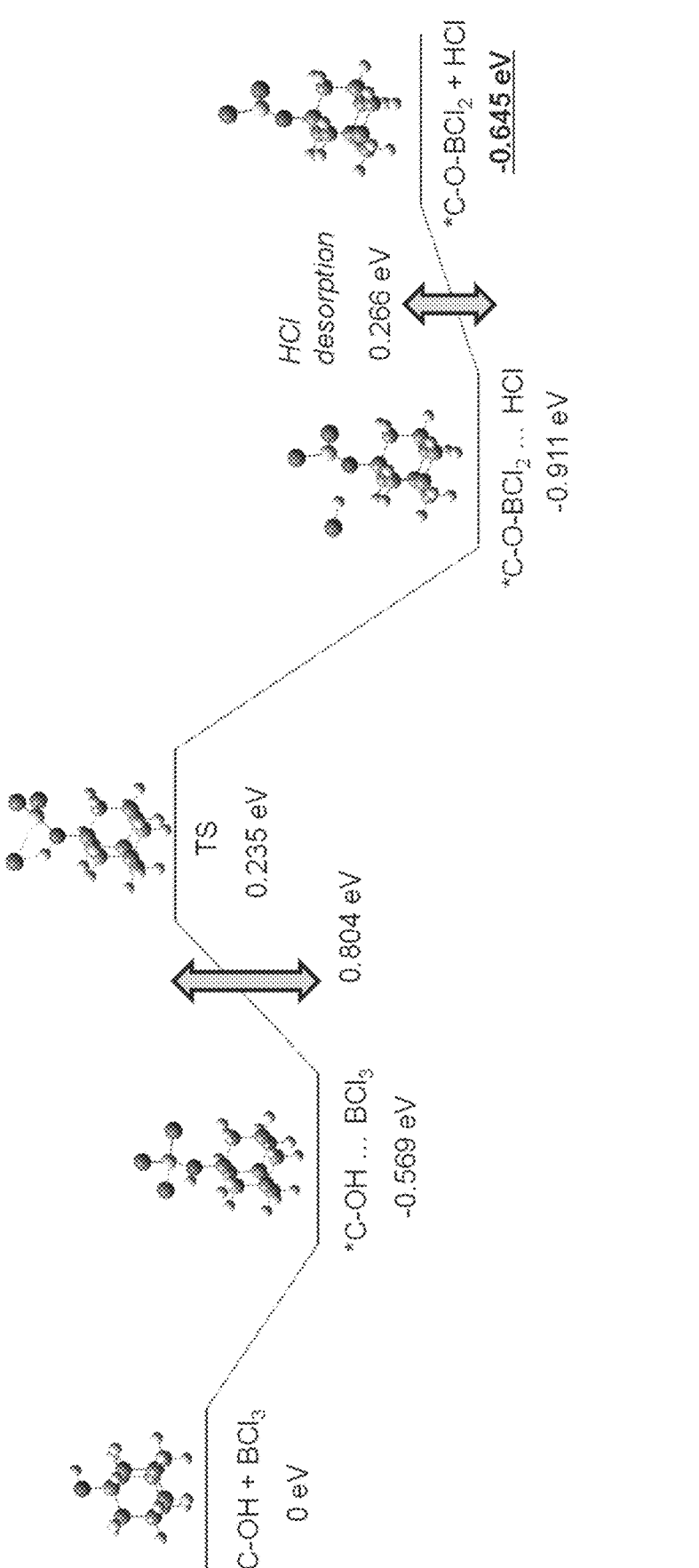
FIG. 9 illustrates an energy level diagram for adsorption and thermal reaction of BCl₃ on a hydroxyl-terminated carbonaceous layer to form a passivation layer in accordance with an embodiment.

FIG. 9 illustrates an energy level diagram for adsorption and thermal reaction of $BCl_3$ on a hydroxy-terminated carbonaceous layer to form a passivation layer in accordance with an embodiment.

The inventors of this application calculated through simulation the formation energy of a possible surface species. As illustrated in FIG. 9, the formation of *C—O—BCl$_2$ surface species as a passivation layer on the hydroxy-terminated carbonaceous layer by $BCl_3$ gas exposure is thermodynamically favorable by about –0.645 eV. The formation of the passivation layer is self-limiting and conformal since the *C—OH is only present at the surface and only *C—OH provides the active side for the precursor (e.g., $BCl_3$) to bind and form chemical bonds (*C—O—BCl$_2$).

Figure 10B:
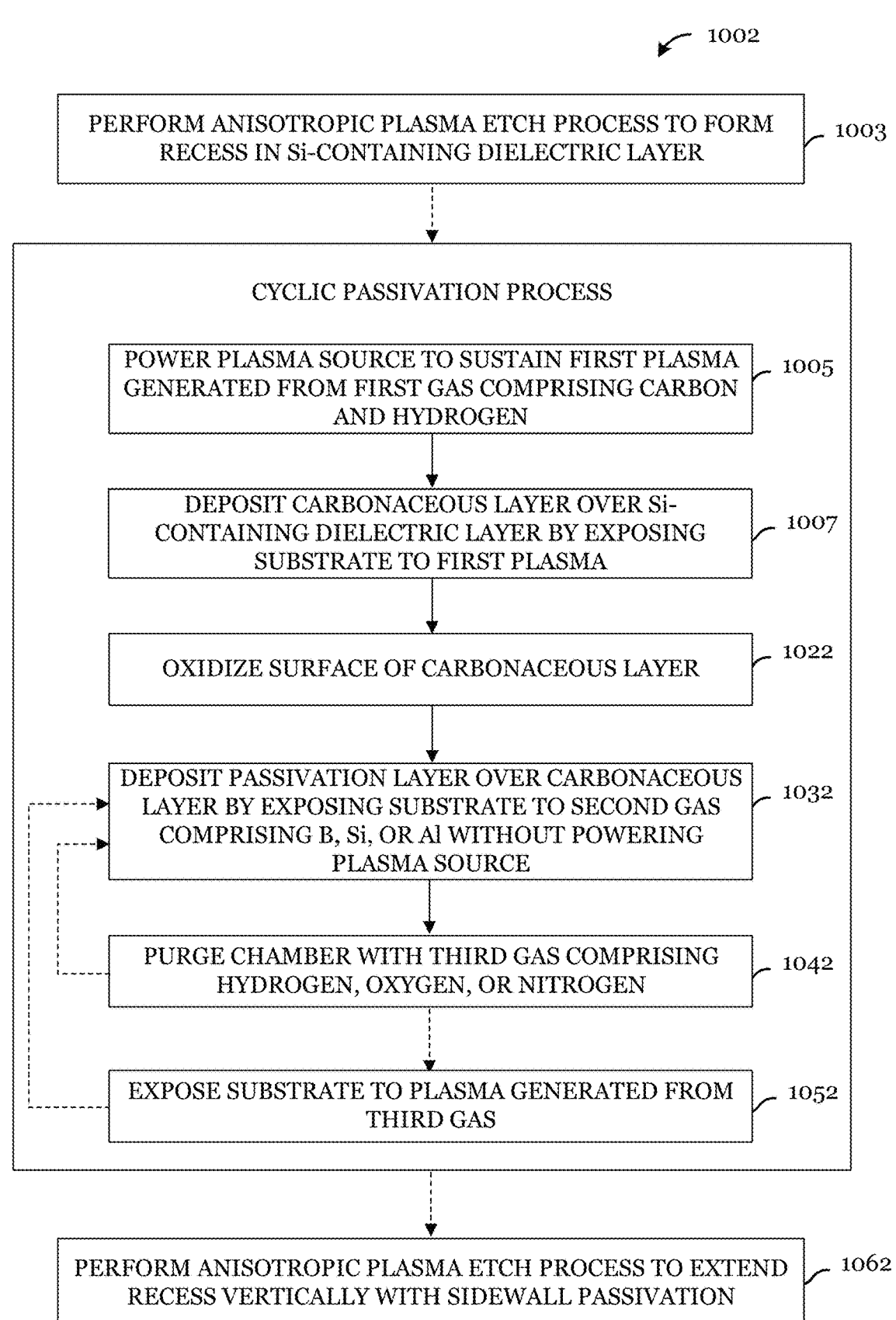
Figure 11:
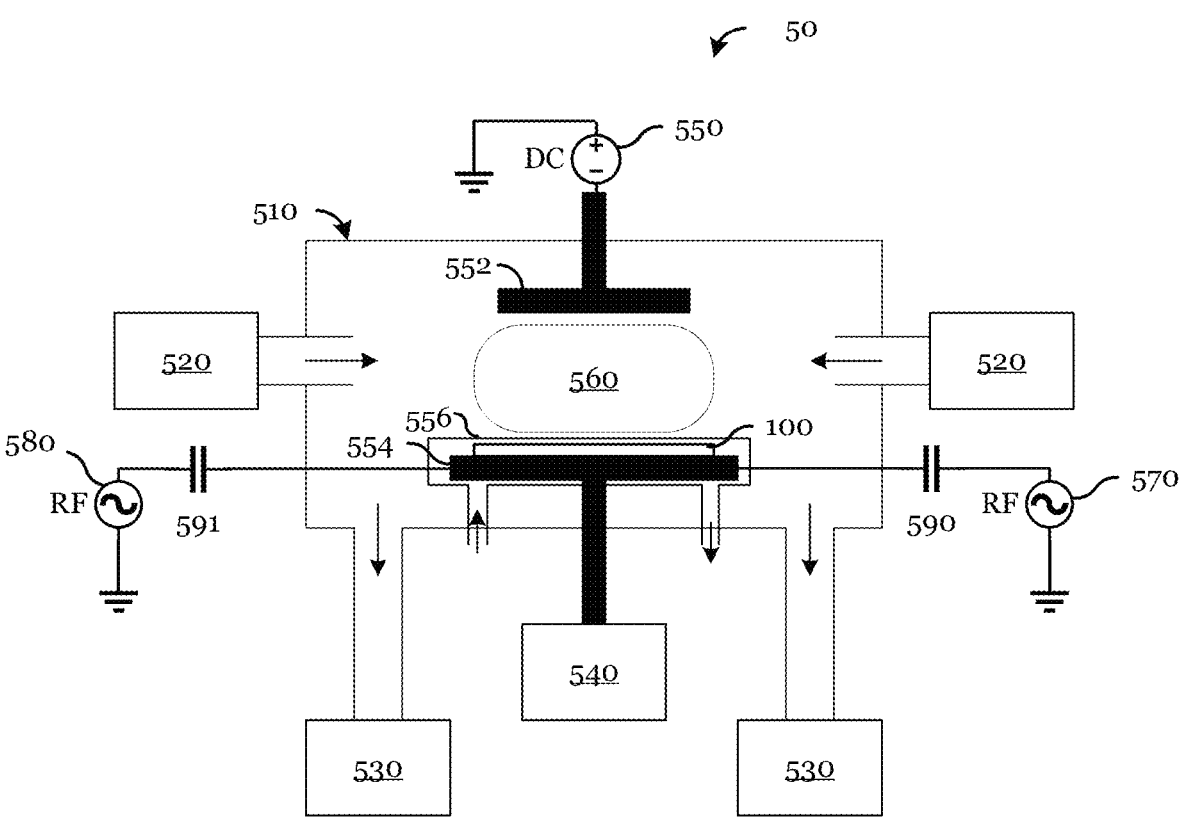
FIG. 11 illustrates an example plasma processing tool in accordance with an embodiment of this disclosure.

FIGS. 10A-10C illustrate process flow charts of methods of passivation in accordance with various embodiments. These process flows can be followed with the figures discussed above (e.g., FIGS. 4A-4E) and hence will not be described again.

In FIG. 10A, a cyclic passivation process 1000 starts with forming a carbon-containing layer (e.g., the *CH layer 210 in FIG. 4A) over sidewalls of a recess in a Si-containing dielectric layer of a substrate by exposing the substrate in a plasma processing chamber to a first plasma generated from a first gas comprising carbon and hydrogen (block 1010, e.g., FIG. 4A). Next, the surface of the carbon-containing layer may be modified by exposing the substrate a second plasma generated from a second gas comprising oxygen (block 1020, e.g., FIG. 4B). A passivation layer may then be formed over the modified surface of the carbon-containing layer by exposing the substrate to a third gas comprising B, Si, or Al (block 1030, e.g., FIG. 4C). In certain embodiments, the plasma processing chamber may then be purged with a fourth gas comprising a hydrogen-containing gas, an oxygen-containing gas, or nitrogen-containing gas. The fourth gas may react with the passivation layer to modify the surface of the passivation layer (block 1040, e.g., FIG. 4D). In one or more embodiments, the modification of the surface of the passivation layer may be achieved, after the purge with the fourth gas, by exposing the substrate to another plasma generated from the fourth gas (block 1050). The steps of forming the passivation layer (block 1030) and modifying its surface (blocks 1040 and 1050) may be repeated for any number of times to achieve a target thickness for the passivation layer.

In FIG. 10B, a process flow 1002 may start with an optional anisotropic plasma etch process, prior to a cyclic passivation process, to form a recess having sidewalls in a Si-containing dielectric layer of a substrate (block 1003, e.g., FIGS. 2 and 3). The cyclic passivation process in a plasma processing chamber then starts with powering a plasma source of the plasma processing chamber to sustain a first plasma generated from a first gas comprising carbon and hydrogen (block 1005), followed by depositing a carbonaceous layer over the Si-containing dielectric layer by exposing the substrate to the first plasma (block 1007, e.g., FIG. 4A). Next, the surface of the carbonaceous layer may be oxidized (block 1022, e.g., FIG. 4B). A passivation layer may then be formed over the carbon-containing layer by exposing the substrate to a second gas comprising B, Si, or Al without powering the plasma source (block 1032, e.g., FIG. 4C). Subsequently, in certain embodiments, the plasma processing chamber may be purged with a third gas comprising a hydrogen-containing gas, an oxygen-containing gas, or nitrogen-containing gas. The third gas may react with the passivation layer to modify the surface of the passivation layer (block 1042, e.g., FIG. 4D). In one or more embodiments, the modification of the surface of the passivation layer may be achieved, after the purge with the third gas, by exposing the substrate to another plasma generated from the third gas (block 1052). The steps of forming the passivation layer (block 1032) and modifying its surface (blocks 1042 and 1052) may be repeated for any number of times to achieve a target thickness for the passivation layer. Additionally, after the cyclic passivation process, another anisotropic plasma etch process may be performed to extend the recess vertically, wherein the passivation layer prevents laterally etching the Si-containing dielectric layer (block 1062, e.g., FIGS. 4E and 5).

In FIG. 10C, a cyclic process flow 1004 may start with forming a recess in a Si-containing layer of a substrate by exposing the substrate, in a plasma processing chamber, to a first plasma generated from a first gas comprising carbon and fluorine, where a first carbonaceous layer is formed over sidewalls of the recess (block 1006, e.g., FIGS. 2 and 3). Next, a second carbonaceous layer may be formed over the first carbonaceous layer by exposing the substrate to a second plasma generated from a second gas comprising carbon and hydrogen (block 1014, e.g., FIG. 4A). Subsequently, the surface of the second carbonaceous layer may be modified to be hydrophilic (block 1024, e.g., FIG. 4B), followed by depositing a passivation layer over the second carbonaceous layer by exposing the substrate to a third gas comprising B, Si, or Al (block 1034, FIG. 4C). The plasma processing chamber may then be purged with a fourth gas comprising a hydrogen-containing gas, an oxygen-containing gas, or nitrogen-containing gas. The fourth gas may react with the passivation layer to modify the surface of the passivation layer (block 1044, e.g., FIG. 4D). In one or more embodiments, the modification of the surface of the passivation layer may be achieved, after the purge with the fourth gas, by exposing the substrate to another plasma generated from the fourth gas (block 1054). The steps of forming the passivation layer (block 1034) and modifying its surface (blocks 1044 and 1054) may be repeated for any number of times to achieve a target thickness for the passivation layer. After this passivation process, the recess in the Si-containing layer may be extended vertically by a plasma etch process, where the passivation layer prevents laterally etching the Si-containing dielectric layer (block 1064, e.g., FIGS. 4E and 5). The passivation and etch may be performed as a cyclic process to ensure sidewall passivation until a high aspect ratio (HAR) feature may be fabricated. Accordingly, the steps of passivation (blocks 1014, 1024, 1034, 1044, and 1054) may be repeated to passivate newly exposed sidewalls in the Si-containing layer before performing a next cycle of the plasma etch process to further extend the recess.

In various embodiments of the disclosure, the cyclic etch process may be performed in a plasma processing chamber. An example plasma processing tool for the embodiment methods is illustrated in FIG. 11.

For illustrative purposes, FIG. 11 illustrates a substrate 100 placed on a substrate holder 554 (e.g., a circular electrostatic chuck (ESC)) inside a plasma processing chamber 510 near the bottom. The substrate 100 may be optionally maintained at a desired temperature using a heater/cooler 556 that surrounds the substrate holder 554. The temperature of the substrate 100 may be maintained by a temperature controller 540 connected to the substrate holder 554 and the heater/cooler 556. The ESC may be coated with a conductive material (e.g., a carbon-based or metal-nitride based coating) so that electrical connections may be made to the substrate holder 554.

As illustrated in FIG. 11, the substrate holder 554 may be a bottom electrode of the plasma processing chamber 510. In the illustrative example in FIG. 11, the substrate holder 554 is connected to two RF-bias power sources, 570 and 580 through blocking capacitors 590 and 591. In some embodiment, a conductive circular plate inside the plasma processing chamber 510 near the top is the top electrode 552. In FIG. 11, the top electrode 552 is connected to a DC power source 550 of the plasma processing system 50.

The gases may be introduced into the plasma processing chamber 510 by a gas delivery system 520. The gas delivery system 520 comprises multiple gas flow controllers to control the flow of multiple gases into the chamber. Each of the gas flow controllers of the gas delivery system 520 may be assigned for each of fluorocarbons, noble gases, or balancing agents. In some embodiments, optional center/edge splitters may be used to independently adjust the gas flow rates at the center and edge of the substrate 100.

The RF-bias power sources 570 and 580 may be used to supply continuous wave (CW) or pulsed RF power to sustain the plasma, such as a plasma 560. The plasma 560, shown between the top electrode 552 and the bottom electrode (also the substrate holder 554), exemplifies direct plasma generated close to the substrate 100 in the plasma processing chamber 510 of the plasma processing system 50. Etching may be performed by exposing the substrate 100 to the plasma 560 while powering the substrate holder 554 with RF-bias power sources 570, 580 and optionally the top electrode 552 with the DC power source 550.

The configuration of the plasma processing system 50 described above is by example only. In alternative embodiments, various alternative configurations may be used for the plasma processing system 50. For example, inductively coupled plasma (ICP) may be used with RF source power coupled to a planar coil over a top dielectric cover, the gas inlet or the gas outlet may be coupled to the upper wall, etc. In various embodiments, the RF power, chamber pressure, substrate temperature, gas flow rates and other plasma process parameters may be selected in accordance with the respective process recipe. In some embodiments, the plasma processing system 50 may be a resonator such as a helical resonator.

Although not described herein, embodiments of the present invention may be also applied to remote plasma systems as well as batch systems. For example, the substrate holder may be able to support a plurality of wafers that are spun around a central axis as they pass through different plasma zones.

Example embodiments of the invention are summarized here. Other embodiments can also be understood from the entirety of the specification as well as the claims filed herein.

Example 1. A method for processing a substrate that includes: performing a cyclic process including a plurality of cycles, where the cyclic process includes, forming a carbon-containing layer over sidewalls of a recess in a Si-containing dielectric layer of the substrate, the forming including exposing the substrate disposed in a plasma processing chamber to a first plasma generated from a first gas including carbon and hydrogen, modifying a surface of the carbon-containing layer by exposing the substrate to a second plasma generated from a second gas including oxygen, and forming a passivation layer over the modified surface of the carbon-containing layer by exposing the substrate to a third gas including B, Si, or Al.

Example 2. The method of example 1, where the cyclic process further includes after forming the passivation layer, purging the plasma processing chamber with a fourth gas including a hydrogen-containing gas, an oxygen-containing gas, or a nitrogen-containing gas.

Example 3. The method of one of examples 1 or 2, where the cyclic process further includes after the purging modifying a surface of the passivation layer by exposing the substrate to another plasma generated from the fourth gas.

Example 4. The method of one of examples 1 to 3, where the hydrogen-containing gas includes $H_2$, $H_2O$, $CH_4$, HBr, $CH_3F$, $CH_4$, HBr, $CH_3F$, or $NH_3$, the oxygen-containing gas includes $O_2$, CO, $CO_2$, or $H_2O$, and the nitrogen-containing gas includes $N_2$ or $NH_3$.

Example 5. The method of one of examples 1 to 4, where the first gas includes hydrocarbon or hydrofluorocarbon.

Example 6. The method of one of examples 1 to 5, where the second gas includes dioxygen ($O_2$).

Example 7. The method of one of examples 1 to 6, where the third gas includes $BCl_3$, $BH_3$, $BBr_3$, $SiCl_xH_{4-x}$ (x=0-4), $Si_2Cl_xH_{6-x}$ (x=0-6), $AlCl_3$, or $AlF_x$ $(CH_3)_{3-x}$ (x=0-2).

Example 8. The method of one of examples 1 to 7, further including after performing the cyclic process, vertically extending the recess into the Si-containing dielectric layer of the substrate.

Example 9. The method of one of examples 1 to 8, where the recess is vertically extended by exposing the substrate to a yet another plasma generated from a gas including fluorine.

Example 10. The method of one of examples 1 to 9, further including: before forming the first passivation layer, forming the recess by performing an anisotropic plasma etch process by using a patterned etch mask including carbon disposed over the Si-containing dielectric layer.

Example 11. The method of one of examples 1 to 10, where the Si-containing dielectric layer includes silicon oxide or silicon nitride.

Example 12. A method for processing a substrate that includes: performing a cyclic passivation process in a plasma processing chamber having a plasma source, the cyclic passivation process including a plurality of cycles, where a cycle of the cyclic passivation process includes powering the plasma source to sustain a first plasma generated from a first gas including carbon and hydrogen, depositing a carbonaceous layer over a Si-containing dielectric layer of the substrate by exposing the substrate to the first plasma, oxidizing a surface of the carbonaceous layer, depositing a passivation layer over the carbonaceous layer by exposing the substrate to a second gas including B, Si, or Al without powering the plasma source, and purging the plasma processing chamber with a third gas including a hydrogen-containing gas, an oxygen-containing gas, or a nitrogen-containing gas.

Example 13. The method of example 12, where the cycle of the cyclic passivation process further includes exposing the substrate to a plasma generated from the third gas by powering the plasma source.

Example 14. The method of one of examples 12 or 13, where the second gas includes $BCl_3$, $BH_3$, $BBr_3$, $SiCl_xH_{4-x}$ (x=0-4), $Si_2Cl_xH_{6-x}$ (x=0-6), $AlCl_3$, or $AlF_x$ $(CH_3)_{3-x}$ (x=0-2).

Example 15. The method of one of examples 12 to 14, where the third gas includes $H_2$, $N_2$, $O_2$, CO, $CO_2$, $H_2O$, $CH_4$, HBr, $CH_3F$, $NH_3$, $CH_4$, HBr, $CH_3F$, $H_2O$, or $NH_3$.

Example 16. The method of one of examples 12 to 15, further including: before the cyclic passivation process, performing an anisotropic plasma etch process to form a recess in the Si-containing dielectric layer, where the cyclic passivation process forms the passivation layer over sidewalls of the recess; and after the cyclic passivation process, performing another anisotropic plasma etch process to extend the recess vertically, where the passivation layer prevents laterally etching the Si-containing dielectric layer.

Example 17. A method for processing a substrate that includes: performing a plurality of cycles of a cyclic etch process to form a recess in a Si-containing dielectric layer of a substrate loaded in a plasma processing chamber, the substrate including a patterned etch mask formed over the Si-containing dielectric layer, one of the plurality of cycles of the cyclic etch process including forming a recess in the Si-containing layer by exposing the substrate to a first plasma generated from a first gas including carbon and fluorine, the exposing forming a first carbonaceous layer over sidewalls of the recess; forming a second carbonaceous layer over the first carbonaceous layer by exposing the substrate to a second plasma generated from a second gas including carbon and hydrogen; modifying a surface of the second carbonaceous layer to be hydrophilic; depositing a passivation layer over the second carbonaceous layer by exposing the substrate to a third gas including B, Si, or Al; purging the plasma processing chamber with a fourth gas including a hydrogen-containing gas, an oxygen-containing gas, or nitrogen-containing gas; and extending the recess vertically by a plasma etch process, the passivation layer preventing laterally etching the Si-containing dielectric layer.

Example 18. The method of example 17, where modifying the surface of the second carbonaceous layer to be hydrophilic includes introducing a hydroxyl (OH) group, a carbonyl (C=O) group, a carboxyl (COOH) group, or amino group ($NH_2$) group to the surface of the second carbonaceous layer.

Example 19. The method of one of examples 17 or 18, where the first gas includes a fluorocarbon, the second gas includes a hydrocarbon, and the third gas includes $BCl_3$, $BH_3$, $BBr_3$, $SiCl_xH_{4-x}$ (x=0-4), $Si_2Cl_xH_{6-x}$ (x=0-6), $AlCl_3$, or $AlF_x$ $(CH_3)_{3-x}$ (x=0-2).

Example 20. The method of one of examples 17 to 19, where the one of the plurality of cycles of the cyclic etch process further includes: modifying a surface of the passivation layer by exposing the substrate to a plasma generated from the fourth gas; and repeating the steps of depositing the passivation layer and modifying the surface of the passivation layer.

Example 21. A method for processing a substrate that includes: performing a plurality of cycles of a cyclic etch process to form a recess in a Si-containing dielectric layer of a substrate loaded in a plasma processing chamber, the substrate including a patterned etch mask formed over the Si-containing dielectric layer, one of the plurality of cycles of the cyclic etch process including forming a recess in the Si-containing layer by exposing the substrate to a first plasma generated from a first gas including carbon and fluorine, the exposing forming a carbonaceous layer over sidewalls of the recess; removing the carbonaceous layer from the sidewalls of the recess to expose a surface of the Si-containing dielectric layer; depositing a passivation layer over the Si-containing dielectric layer by exposing the substrate to a second gas including B, Si, or Al, the passivation layer being in physical contact with the Si-containing dielectric layer; purging the plasma processing chamber with a third gas including a hydrogen-containing gas, an oxygen-containing gas, or nitrogen-containing gas; and extending the recess vertically by a plasma etch process, the passivation layer preventing laterally etching the Si-containing dielectric layer.

Example 22. The method of example 21, where the one of the plurality of cycles of the cyclic etch process further includes, prior to depositing the passivation layer, modifying the surface of the Si-containing dielectric layer to be hydrophilic.

Example 23. The method of one of examples 21 or 22, where modifying the surface of the Si-containing dielectric layer to be hydrophilic includes introducing a hydroxyl (OH) group, a carbonyl (C=O) group, a carboxyl (COOH) group, or amino group ($NH_2$) group to the surface of the Si-containing dielectric layer.

Example 24. The method of one of examples 21 to 23, where the first gas includes a fluorocarbon, the second gas includes $BCl_3$, $BH_3$, $BBr_3$, $SiCl_xH_{4-x}$ (x=0-4), $Si_2Cl_xH_{6-x}$ (x=0-6), $AlCl_3$, or $AlF_x$ $(CH_3)_{3-x}$ (x=0-2).

Example 25. The method of one of examples 21 to 24, where the one of the plurality of cycles of the cyclic etch process further includes: modifying a surface of the passivation layer by exposing the substrate to a plasma generated from the third gas; and repeating the steps of depositing the passivation layer and modifying the surface of the passivation layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

performing a cyclic process comprising a plurality of cycles, wherein one cycle of the cyclic process comprises:

forming a first carbon-containing layer over sidewalls of a recess in a Si-containing dielectric layer of the substrate, the forming comprising exposing the substrate disposed in a plasma processing chamber to a first plasma generated from a first gas comprising carbon and fluorine;

forming a second carbon-containing layer over the first carbon-containing layer, the forming comprising exposing the substrate disposed in the plasma processing chamber to a second plasma generated from a second gas comprising carbon and hydrogen, the second plasma being different from the first plasma, wherein the second carbon-containing layer has a hydrophobic surface essentially terminated with *CH groups;

modifying the hydrophobic surface of the second carbon-containing layer to become a hydrophilic surface terminated with *COH groups, the modifying comprising exposing the substrate to a third plasma generated from a third gas comprising oxygen; and forming a passivation layer over the hydrophilic surface of the second carbon-containing layer by exposing the substrate to a fourth gas comprising B, Si, or Al.

2. The method of claim 1, wherein the cyclic process further comprises after forming the passivation layer, purging the plasma processing chamber with a fifth gas comprising a hydrogen-containing gas, an oxygen-containing gas, or a nitrogen-containing gas.

3. The method of claim 2, wherein the cyclic process further comprises after the purging modifying a surface of the passivation layer by exposing the substrate to another plasma generated from the fifth gas.

4. The method of claim 2, wherein the hydrogen-containing gas comprises $H_2$, $H_2O$, $CH_4$, HBr, $CH_3F$, or $NH_3$, the oxygen-containing gas comprises $O_2$, CO, $CO_2$, or $H_2O$, and the nitrogen-containing gas comprises $N_2$ or $NH_3$.

5. The method of claim 1, wherein the second gas comprises hydrocarbon or hydrofluorocarbon.

6. The method of claim 1, wherein the third gas comprises dioxygen ($O_2$).

7. The method of claim 1, wherein the fourth gas comprises $BCl_3$, $BH_3$, $BBr_3$, $SiCl_xH_{4-x}$ (x=0-4), $Si_2Cl_xH_{6-x}$ (x=0-6), $AlCl_3$, or $AlF_x(CH_3)_{3-x}$ (x=0-2).

8. The method of claim 1, further comprising after performing the cyclic process, vertically extending the recess into the Si-containing dielectric layer of the substrate.

9. The method of claim 8, wherein the recess is vertically extended by exposing the substrate to another plasma generated from a gas comprising fluorine.

10. The method of claim 1, wherein forming the recess further comprises using a patterned etch mask comprising carbon disposed over the Si-containing dielectric layer.

11. The method of claim 1, wherein the Si-containing dielectric layer comprises silicon oxide or silicon nitride.

12. A method for processing a substrate, the method comprising:

performing a cyclic passivation process in a plasma processing chamber having a plasma electrode, the cyclic passivation process comprising a plurality of cycles, wherein a cycle of the cyclic passivation process comprises:

powering the plasma electrode to sustain a first plasma generated from a first gas comprising carbon and fluorine;

depositing a first carbonaceous layer over sidewalls of a recess in a Si-containing dielectric layer, the depositing comprising exposing the substrate to the first plasma;

powering the plasma electrode to sustain a second plasma generated from a second gas comprising carbon and hydrogen;

depositing a second carbonaceous layer over the first carbonaceous layer, the depositing of the second carbonaceous layer comprising exposing the substrate to the second plasma, the second carbonaceous layer having a different composition than the first carbonaceous layer, wherein the second carbonaceous layer has a hydrophobic surface essentially terminated with *CH groups;

oxidizing the hydrophobic surface of the second carbonaceous layer to be a hydrophilic surface terminated with *COH groups;

depositing a passivation layer over the second carbonaceous layer by exposing the substrate to a third gas comprising B, Si, or Al without powering the plasma electrode; and purging the plasma processing chamber with a fourth gas comprising a hydrogen-containing gas, an oxygen-containing gas, or a nitrogen-containing gas.

13. The method of claim 12, wherein the cycle of the cyclic passivation process further comprises exposing the substrate to a plasma generated from the fourth gas by powering the plasma electrode.

14. The method of claim 12, wherein the third gas comprises $BCl_3$, $BH_3$, $BBr_3$, $SiCl_xH_{4-x}$ (x=0-4), $Si_2Cl_xH_{6-x}$ (x=0-6), $AlCl_3$, or $AlF_x(CH_3)_{3-x}$ (x=0-2).

15. The method of claim 12, wherein the fourth gas comprises $H_2$, $N_2$, $O_2$, CO, $CO_2$, $H_2O$, $CH_4$, HBr, $CH_3F$, or $NH_3$.

16. The method of claim 12, further comprising:

after the cyclic passivation process, performing another anisotropic plasma etch process to extend the recess vertically, wherein the passivation layer prevents laterally etching the Si-containing dielectric layer.

17. A method for processing a substrate, the method comprising:

performing a plurality of cycles of a cyclic etch process to form a recess in a Si-containing dielectric layer of a substrate loaded in a plasma processing chamber, the substrate comprising a patterned etch mask formed over the Si-containing dielectric layer, one of the plurality of cycles of the cyclic etch process comprising:

forming a recess in the Si-containing layer by exposing the substrate to a first plasma generated from a first gas comprising carbon and fluorine, the exposing forming a first carbonaceous layer over sidewalls of the recess;

forming a second carbonaceous layer over the first carbonaceous layer by exposing the substrate to a second plasma generated from a second gas comprising carbon and hydrogen, the second carbonaceous layer having a different composition than the first carbonaceous layer, wherein the second carbonaceous layer has a hydrophobic surface mostly terminated with *CH groups;

modifying the hydrophobic surface of the second carbonaceous layer to be a hydrophilic surface terminated with *COH groups;

depositing a passivation layer over the second carbonaceous layer by exposing the substrate to a third gas comprising B, Si, or Al;

purging the plasma processing chamber with a fourth gas comprising a hydrogen-containing gas, an oxygen-containing gas, or nitrogen-containing gas; and extending the recess vertically by a plasma etch process, the passivation layer preventing laterally etching the Si-containing dielectric layer.

18. The method of claim 17, wherein modifying the surface of the second carbonaceous layer to be hydrophilic comprises introducing a hydroxyl (OH) group, a carbonyl (C=O) group, a carboxyl (COOH) group, or an amino group ($NH_2$) group to the surface of the second carbonaceous layer.

19. The method of claim 17, wherein the first gas comprises a fluorocarbon, the second gas comprises a hydrocarbon, and the third gas comprises $BCl_3$, $BH_3$, $BBr_3$, $SiCl_xH_{4-x}$ (x=0-4), $Si_2Cl_xH_{6-x}$ (x=0-6), $AlCl_3$, or $AlF_x(CH_3)_{3-x}$ (x=0-2).

20. The method of claim 17, wherein the one of the plurality of cycles of the cyclic etch process further comprises:

modifying a surface of the passivation layer by exposing the substrate to a plasma generated from the fourth gas; and repeating the steps of depositing the passivation layer and modifying the surface of the passivation layer.

* * * * *